(12) United States Patent
Frisch

(10) Patent No.: US 7,171,601 B2
(45) Date of Patent: Jan. 30, 2007

(54) PROGRAMMABLE JITTER GENERATOR

(75) Inventor: Arnold M. Frisch, Portland, OR (US)

(73) Assignee: Credence Systems Corporation, Milpitas, CA (US)

( * ) Notice: Subject to any disclaimer, the term of this patent is extended or adjusted under 35 U.S.C. 154(b) by 445 days.

(21) Appl. No.: 10/646,957

(22) Filed: Aug. 21, 2003

(65) Prior Publication Data

US 2005/0044463 A1    Feb. 24, 2005

(51) Int. Cl.
*G01R 31/3187*   (2006.01)
*G01R 31/316*    (2006.01)
(52) U.S. Cl. .............. 714/738; 714/726; 714/724; 714/733
(58) Field of Classification Search .......... 714/738, 714/726, 718, 724, 733; 365/201, 45; 324/765; 368/113
See application file for complete search history.

(56) References Cited

U.S. PATENT DOCUMENTS

| | | | |
|---|---|---|---|
| 5,144,525 A * | 9/1992 | Saxe et al. ............... | 365/45 |
| 5,793,822 A | 8/1998 | Anderson et al. | |
| 5,796,745 A * | 8/1998 | Adams et al. ............ | 714/718 |
| 5,815,512 A * | 9/1998 | Osawa et al. ............ | 714/726 |
| 5,835,501 A | 11/1998 | Dalmia et al. | |
| 5,948,115 A * | 9/1999 | Dinteman ................ | 714/738 |
| 6,006,347 A * | 12/1999 | Churchill et al. ......... | 714/724 |
| 6,295,315 B1 | 9/2001 | Frisch et al. | |
| 6,463,560 B1 * | 10/2002 | Bhawmik et al. ......... | 714/733 |
| 6,501,693 B2 * | 12/2002 | Takatsuka et al. ........ | 365/201 |
| 6,535,014 B2 * | 3/2003 | Chetlur et al. ........... | 324/765 |
| 6,611,477 B1 * | 8/2003 | Speyer et al. ........... | 368/113 |

* cited by examiner

*Primary Examiner*—Albert Decady
*Assistant Examiner*—Dipakkumar Gandhi
(74) *Attorney, Agent, or Firm*—Daniel M. Bedell; Smith-Hill and Bedell

(57) ABSTRACT

A jitter generator produces a jittery test signal for use in performing a jitter test on an integrated circuit (IC) device under test (DUT). The jitter generator includes a programmable delay circuit for delaying a non-jittery input signal with a varying delay controlled by input digital delay control data to produce the test signal. A pattern generator supplies a sequence of delay control data to the programmable delay circuit causing it to produce a desired jitter pattern in the test signal. During a calibration process, a measurement unit feeds the test signal back to the input of the programmable delay circuit, causing the test signal to oscillate with a period proportional to the delay through the delay circuit. The measurement unit then measures the period of the test signal for various values of delay control data and reports measurement results. Based on the measurement results, host equipment then determines an appropriate sequence of delay control data for producing a desired jitter pattern in the test signal and programs the pattern generator to produce that sequence of delay control data during a jitter test. The jitter generator can form a part of a built-in, self-test (BIST) circuit implemented within the DUT itself.

35 Claims, 7 Drawing Sheets

PROGRAMMABLE JITTER GENERATOR

BACKGROUND OF THE INVENTION

1. Field of the Invention

The invention relates in general to integrated jitter generators for adding a controlled amount of jitter to a signal during a jitter test.

2. Description of Related Art

When a transmitting IC transmits a digital data signal to a receiving IC, the transmitter typically synchronizes state changes in the digital data signal to leading (or trailing) edges of a periodic clock signal so that the state changes within the data signal will occur at predictable times. To produce a data sequence represented by successive states of the digital signal, the receiver need only digitize the data signal with an appropriate sampling phase and frequency. In some communication systems, a transmitter sending a digital data signal to a receiver also sends a clock signal to the receiver for controlling the timing with which the receiver samples the data signal. In other communication systems the receiver may include a "clock recovery" system for generating the sampling clock signal locally, using a feedback control system to adjust the phase and frequency of the sampling clock signal based on an analysis of data the receiver acquires by sampling the data signal.

While a transmitter may synchronize edges in a data signal to edges of a clock signal, a data signal can often appear somewhat jittery to a receiver. In a "jittery" digital signal, timing of signal edges vary to some extent relative to the timing of clock signal edges the receiver uses to sample the digital signal. Noise in the signal path conveying the data signal to the receiver can introduce jitter into the data signal. In a system where the transmitter sends a sampling clock signal to the receiver, noise in the clock signal path can cause the receiver to perceive the data signal to be jittery relative to the clock signal. In a receiver employing a clock recovery system to generate a local sampling clock signal, feedback errors or noise in the clock recovery system can cause jitter in the sampling clock signal, thereby causing the data signal to appear jittery relative to the sampling clock signal.

A receiver can tolerate some amount of jitter in a digital signal, but when a digital signal is too jittery, the receiver will not be able to correctly determine each successive state of the digital signal from the samples it acquires. Test specifications for an IC therefore sometimes require that during a logic test, one or more of the IC's input data or clock signals exhibit a specified amount of jitter so that the test will show whether the IC can tolerate that amount of jitter. A conventional IC tester produces a test signal that changes state at controlled times, and therefore might be able to supply a test signal input to an IC exhibiting some specified jitter pattern, provided that the IC tester can control test signal edge timing with sufficient resolution. But for high frequency test signals, a typical IC tester may not have sufficient timing resolution to do that. Even when an IC tester can generate a test signal having a controlled amount of amount of jitter, the signal path between the tester and the IC may be subject to noise. Thus when the test signal arrives at the IC, it may not only exhibit the controlled amount of jitter introduced by the IC tester, it may also exhibit an additional uncontrolled amount jitter introduced by noise in the signal path between the tester and the IC. The additional uncontrolled jitter in the test signal can cause an IC to fail a jitter test it might otherwise have passed in the absence of the uncontrolled jitter.

One way to reduce the influence of signal path noise on a test signal is to use a built-in, self-test (BIST) circuit within the IC to generate the test signal, thereby keeping the signal path for the TEST signal short and less subject to noise. BIST circuits are also useful for testing embedded subcircuits within an IC that are not directly accessible through the IC's IO terminals. U.S. Pat. No. 5,835,501 issued Nov. 10, 1998 to Dalmia et al describes a built-in, self-test (BIST) circuit incorporated into an IC for performing a jitter test on a circuit within an IC.

FIG. 1 illustrates a BIST circuit 10 employing principles taught by Dalmia et al for generating a jittery test signal supplied as input to a receiver 14 within an IC 12. Receiver 14 normally receives its input signal DIN from one of the IC's IO pins 16 via a multiplexer 18 within BIST circuit 10. The receiver includes a clock recovery system for generating a sampling clock signal and periodically samples DIN in response to the sampling clock signal to produce an output signal DOUT supplied as input to the IC's core logic 20 via another multiplexer 22. During a test, multiplexer 18 delivers a jittery test signal (TEST) produced by a data generator 24 within BIST circuit 10 as the input DIN to receiver 14 and delivers the DOUT signal of receiver 14 to a data analysis circuit 26 within BIST circuit 10. A clock synthesizer circuit 28 supplies a jittery clock signal CLK to data generator 24 for controlling edge timing in the TEST signal, and since the CLK signal is jittery, the TEST signal is jittery. Data analysis circuit 26 looks for errors in DOUT, and following the test, forwards results data to external equipment reporting whether it detected any errors.

FIG. 2 illustrates the clock synthesizer 16 taught by Dalmia et al. Clock synthesizer 28 includes a phase detector 29, a low pass filter 30 and a voltage-controlled oscillator (VCO) 31 for phase locking the CLK signal to the reference clock signal REFCLK. A sine wave generator 32, linked to the input of VCO 31 through a capacitor 33, causes a periodic error in the phase relationship between the CLK and REFCLK signals, thereby producing a controlled jitter in the CLK signal. One drawback to this circuit is that since phase locked loops are inherently jittery, clock synthesizer 28 the CLK signal will exhibit some additional jitter not caused by sine wave generator 32. Also sine wave generator 32 can require a substantial amount of chip space, Dalmia et al teach that it may be preferable to implement sine wave generator 32 off-chip. However, the signal path from sine wave generator 32 to VCO 31 will be long and more susceptible to noise, and therefore prone to adding still more uncontrollable jitter to the CLK signal. Also, that signal path requires use of one of the IC's limited number of IO terminals. Another disadvantage of clock synthesizer 28 of FIG. 2 is that the sine wave jitter pattern that it produces is neither programmable nor calibratable.

U.S. Patent Application Publication No. 2003/0041294A1 published Feb. 27, 2003 on an application filed Apr. 29, 2002 by Moll et al describes a jitter test system as illustrated in FIG. 3. A signal generator 34 supplies a test signal passing through a multiplexer 34, a delay unit 36, and another multiplexer 38 to a device under test (DUT) 38. Delay unit 36 variably delays the test signal with a delay controlled by an analog control signal generated by a control unit 40 so that the test signal input to DUT 38 exhibits a defined jitter pattern. Moll teaches that the control signal could be a rectangular wave, a sine wave or a triangle wave, and that the frequency and amplitude of the jitter in the test signal will vary in the same manner as the amplitude of the control signal. A receiving unit 39 monitors a DUT output signal to determine whether DUT 38 correctly responds to the jittery test signal. Control unit 40 may selectively configure multiplexers 35 and 37 so that the test signal output of signal generator 34 bypasses delay unit 36 when the test signal input to DUT 38 is to be jitter free.

The jitter generator system taught by Moll et al is advantageous over that taught by Dalmia et al in that the frequency and amplitude of the jitter it produces in a test signal can be changed by changing the nature of the analog signal produced by control unit 40. However, the jitter testing system taught by Moll et al has some drawbacks. First, control unit must include some type of programmable signal generator capable of producing an analog control signal having an adjustable frequency, amplitude and shape, and such a programmable signal generator can be relatively expensive. Also, since the signal path between delay unit 36 and DUT 38 is long, noise can cause the test signal input to DUT 38 to exhibit more jitter than specified, thereby causing the DUT to fail a test that it might otherwise have passed had the test signal not been subjected to that noise. Finally, the Moll's system provides no means for calibrating the delay provided by delay unit 36 so that the delay unit produces an expected jitter pattern in the test signal in response to an analog control signal of a particular nature. While the delay of delay unit 36 varies with the magnitude of the analog control signal supplied by control unit 40, due to process variations in delay unit 36 or to variations in ambient temperature, the relationship between the magnitude of the control signal input to delay unit 36 and the delay provided by delay unit 36 can be unpredictable. Thus while a user may be able to program control unit 40 to supply a tightly controlled analog control signal to delay unit 36, the actual jitter pattern it produces in the test signal can vary substantially from the user's expectations.

What is needed is a circuit for performing a jitter test on a signal receiver or on any other type of circuit within an IC using a test signal having a programmable and calibratable amount of jitter.

SUMMARY OF THE INVENTION

During a jitter test, a jitter generator in accordance with the invention supplies a jittery test signal as an input signal to a circuit device under test (DUT) so that other circuits can monitor output signals of the DUT to determine how it behaves in response to the jittery test signal. The jitter generator includes a programmable delay circuit for delaying a non-jittery input signal with a delay controlled by digital delay control data to produce the jittery test signal. The jitter generator also includes a programmable pattern generator for providing a delay control data sequence to the programmable delay circuit causing it to produce a desired jitter pattern in the test signal.

During a calibration process carried out before the test, a measurement unit of the jitter generator feeds the test signal back to the input of the programmable delay circuit and the test signal oscillates with a period proportional to its delay. The measurement unit then measures the period of the test signal for various values of delay control data and reports measurement results to an external host. Based on the measurement results, the host determines an appropriate sequence of delay control data for producing the desired jitter pattern in the test signal during the test, and then programs the pattern generator to produce that sequence of delay control data.

In accordance with a preferred embodiment of the invention, the programmable delay circuit includes a set of cascaded buffers for successively delaying an input signal to produce the test signal. A variable capacitance is applied to the outputs of the buffers, and the delay control data controls the delay through the delay circuit by controlling the amount of capacitance at the output of each buffer. To increase or decrease the delay, the delay control data increases or decreases the capacitance at the outputs of the cascaded buffers.

The input capacitance of a set of load gates suitably provides the variable capacitance at the buffer outputs. Due to the well-known Miller effect, the input capacitance of a load gate increases when the load gate receives a bias current and decreases when the bias current is turned off. Therefore, in the preferred embodiment of the invention, all load gate inputs are directly connected to the buffer outputs and are connected to a bias voltage though switches controlled by the delay control data. In an alternative embodiment of the invention, a set of switches selectively couple the load gate inputs to the buffer outputs, and the delay control data controls the delay of the delay circuit by controlling the number of load gates the switches currently connect to each buffer output.

Thus, a programmable jitter generator in accordance with the invention can produce a signal exhibiting any of a wide variety of well-calibrated jitter patterns. Formed entirely of digital components, the jitter generator is inexpensive to manufacture and well suited for inclusion in an integrated circuit as a part of a built-in, self-test (BIST) circuit for jitter testing the IC.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to a jitter generator for generating a jittery clock or data signal for use in testing an integrated circuit (IC). While this specification illustrates principles of the invention by describing examples considered best modes of practicing the invention, the invention as defined by the claim(s) appended to this specification is not necessarily limited to the particular examples described in the specification below or to the manner in which they operate.

Figure 1:
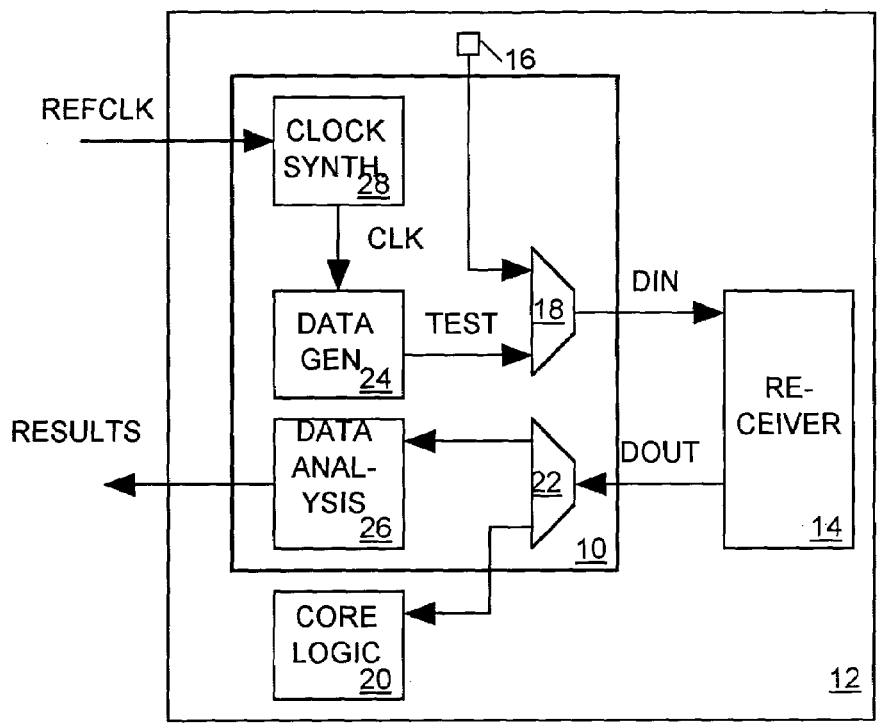
FIG. 1 is a block diagram depicting an IC including a prior art built-in self-test (BIST) circuit.
Figure 2:
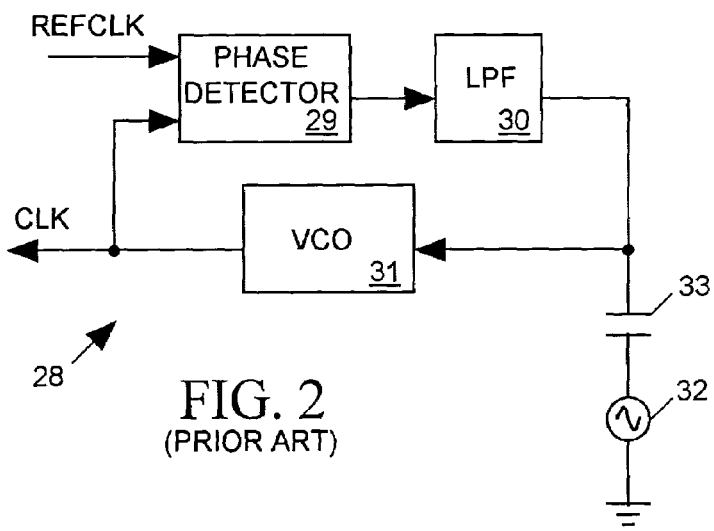
FIG. 2 depicts the prior art clock synthesis circuit of FIG. 1 in more detailed block diagram form.
Figure 3:
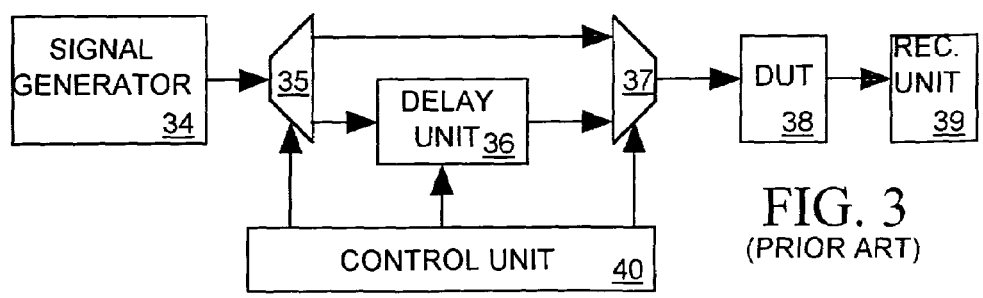
FIG. 3 depicts a prior art jitter testing system in block diagram form.
Figure 4:
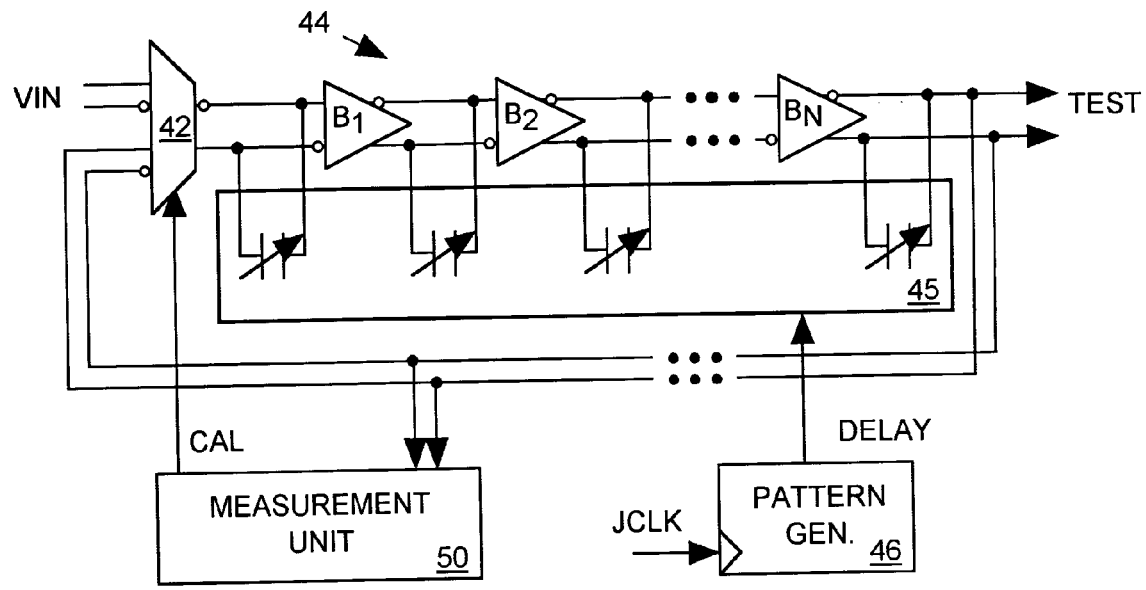
FIG. 4 depicts an example jitter generator in accordance with the invention in block diagram form.

FIG. 4 illustrates an exemplary embodiment of a programmable "jitter generator" 41 in accordance with the invention for adding a controlled amount of jitter to an input signal VIN to produce a jittery test signal (TEST). For example when the VIN signal is a clock signal having periodic rising and falling edges, the TEST signal will be a jittery clock signal having the same average period as the VIN signal, but the timing of rising and falling edges of the TEST signal will vary in a controlled manner relative to corresponding edges of the TEST signal. The VIN signal could also be a digital data signal having edges synchronized to a periodic clock signal, and in that case, the TEST signal will be a jittery data signal wherein edge timing varies relative to edges of the clock signal.

Clock and data signals supplied as input to an IC are normally not supposed to be jittery but since most signals do exhibit some amount of jitter, an IC should be able to function properly even though its input signals may be somewhat jittery. We can test a circuit device under test (DUT) for its tolerance to one or more input signals having a specified amount of jitter by applying one or more appropriately jittery signals as inputs to the DUT and monitoring its output signals to determine whether they behave correctly. Jitter generator 41 of FIG. 4 is particularly suited use in a built-in, self-test (BIST) circuit formed within an IC for performing a jitter test on a subcircuit of the IC because it can add a controlled amount of jitter to any test signal the BIST circuit generates before forwarding the test signal to the subcircuit.

Jitter generator 41 of FIG. 4 includes a multiplexer 42, a programmable delay circuit 44, a programmable pattern generator 46 and a delay measurement system 50. In the jitter generator's normal operating mode, multiplexer 42 delivers the VIN signal to delay circuit 44, and the delay circuit delays the VIN signal by varying amounts of time to produce a jittery TEST signal. Clocked by a jitter clock signal JCLK, pattern generator 46 supplies a sequence of digital DELAY words to delay circuit 44, and each successive DELAY word controls its delay. With pattern generator 46 programmed to produce a suitable DELAY data sequence, jitter generator 41 can produce a jittery TEST signal having any of a wide variety of jitter frequencies and amplitudes.

Programmable delay circuit 44 preferably includes a cascaded set of inverting buffers $B_{1-N}$ and a bank of capacitive circuit elements 45 providing loads of adjustable capacitance at the outputs of multiplexer 42 and buffers $B_{1-N}$. Each successive DELAY data word controls the capacitance of capacitive circuit elements 45, and by increasing or decreasing their capacitance, a DELAY data word can increase or decrease the delay of delay circuit 44. Thus, the pattern of DELAY data words provided by pattern generator 46 determines the nature of the jitter in the TEST signal.

To program jitter generator 41 to produce a desired jitter pattern in the TEST signal, external equipment, such as for example a host computer, programs pattern generator 46 to produce an appropriate DELAY word sequence. Due to process variations in an IC implementing jitter generator 41, an external host that programs pattern generator 46 will not be able to precisely predict the path delay through delay circuit 44 for each possible value of DELAY word. Jitter generator 41 therefore includes a measurement unit 50 enabling the host to measure the actual delay through delay circuit 44 for any particular DELAY word value before programming pattern generator 46.

Figure 5:
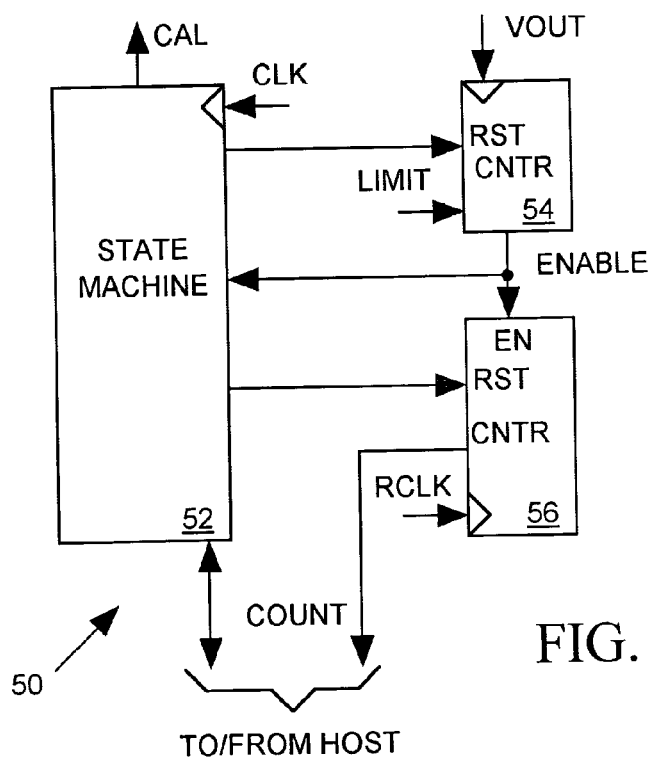
FIG. 5 depicts an example measurement unit of the jitter generator of FIG. 4 in more detailed block diagram form.

As illustrated FIG. 5, an example implementation of measurement unit 50 of FIG. 4 includes a state machine 52 and a pair of counters 54 and 56. To measure the actual path delay through multiplexer 42 and delay circuit 44 for any particular DELAY word value, the host first programs pattern generator 46 to continuously produce only that particular DELAY word value and then signals state machine 52 to begin a measurement process. State machine 52 responds by initially setting a control input (CAL) to multiplexer 42 of FIG. 4 so that it disconnects the VIN signal from the input of delay circuit 44 and negatively feeds the TEST signal back to the delay circuit input. State machine 52 then resets counters 54 and 56. Multiplexer 42 and delay circuit 44 provide an even number of signal inversions in the VIN-to-TEST signal path, but since delay circuit 44 and multiplexer 42 provide an odd number of signal inversions in the feedback path when multiplexer 42 supplies the TEST signal as input to delay circuit 44, the negative feedback causes the TEST signal to oscillate with a period twice the path delay through jitter generator 41. On reset, counter 54 transmits an ENABLE signal to counter 56 allowing counter 56 to begin counting cycles of a stable reference clock signal RCLK. In the meantime, counter 54 begins counting down on each cycle of the TEST signal from a fixed value (LIMIT), and upon counting down to 0, counter 54 turns off the ENABLE input signal to counter 56 causing counter 56 to stop counting RCLK signal cycles. When state machine 52 detects that counter 54 has turned off the ENABLE signal, it signals the host to read the COUNT data. The host can then estimate the VIN-to-TEST signal path delay through jitter generator 41 for that particular DELAY word value as path delay=$(2 \times COUNT \times P_{REF})$/LIMIT where $P_{ref}$ is the period of the reference clock signal RCLK. The host can repeat this measurement process for various DELAY word values to determine appropriate DELAY word values for the sequence of DELAY words pattern generator 46 must generate to produce a desired jitter pattern in the TEST signal.

Jitter generator 41 can form a portion of a BIST circuit incorporated into an IC for testing the response of a subcircuit of the IC to a jittery test signal. Pattern generator 46 and measurement unit 50 could reside outside the IC, but they preferably reside within the IC, particularly when it is helpful to limit the BIST circuit's use of the IC's IO terminals.

Figure 6:
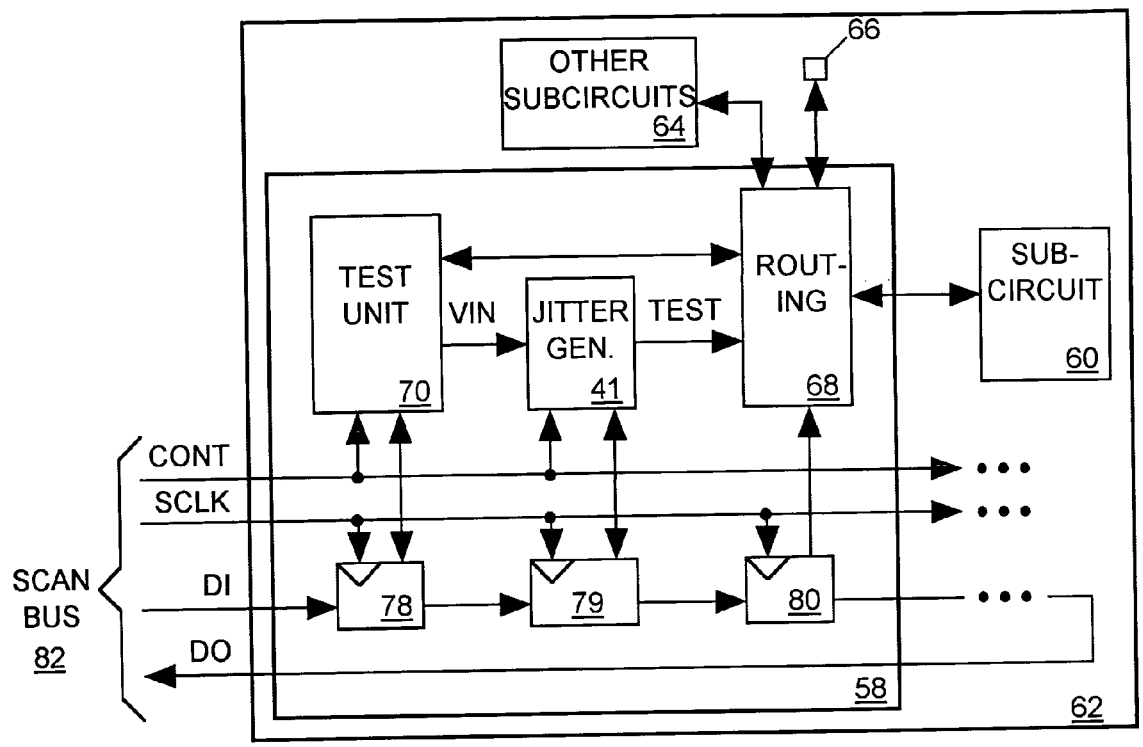
FIGS. 6–8 depict in block diagram form example BIST circuits in accordance with the invention, each incorporating the jitter generator of FIG. 4.

FIG. 6 illustrates in block diagram form an example BIST circuit 58 in accordance with the invention for testing a subcircuit 60 of an IC 62 that normally communicates with other subcircuits 64 and/or IO terminals 66 of IC 62. A routing circuit 68 within BIST circuit 58 normally links the input and output terminals of subcircuit 60 to other subcircuits 64 or IO pins 66, but when BIST circuit 58 is to test subcircuit 60, routing circuit 68 connects the input and output terminals of circuit 58 to terminals of a test unit 70 within BIST circuit 58. During a test, test unit 70 transmits test signals to subcircuit 60 and monitors it's output signals to determine whether subcircuit 60 behaves as expected. In this example, one of the test signal outputs of test unit 70 provides the VIN signal input to a jitter generator 41 of the type illustrated in FIG. 4, and routing circuit 68 delivers the jittery TEST signal output of jitter generator 41 as a test signal input to subcircuit 60. For example, the TEST signal might simulate a jittery data or clock signal subcircuit 60 might normally receive via IO terminal 66.

BIST circuit 58 communicates with an external host such as, for example, a computer or an IC tester through a set of scan registers 78, 79 and 80 and a scan bus 82. When the host wants to transmit data to BIST circuit 58, it serially shifts the data into scan registers 78–80 via a data input line DI using a clock signal SCLK to clock the scan registers. The host then pulses a control signal CONT telling test unit 70 and jitter generator 41 that valid data may be available in registers 78 and 79. When communicating with test unit 70, the host will set one of the bits in register 78 to indicate that other data in register 78 is a valid input, and if that bit is true, test unit 70 will respond to the other data in register 78. Similarly, when communicating with jitter generator 70, the host will set one of the bits in register 79 to indicate that other data in register 79 is a valid input. Test unit 70 and jitter generator 41 can also write test and path measurement results data into scan registers 78 and 79 so that the host can thereafter serially shift that data out of registers 78 and 79 and onto a data output line DO of scan bus 82 conveying the test results data back to the host.

Figure 7:
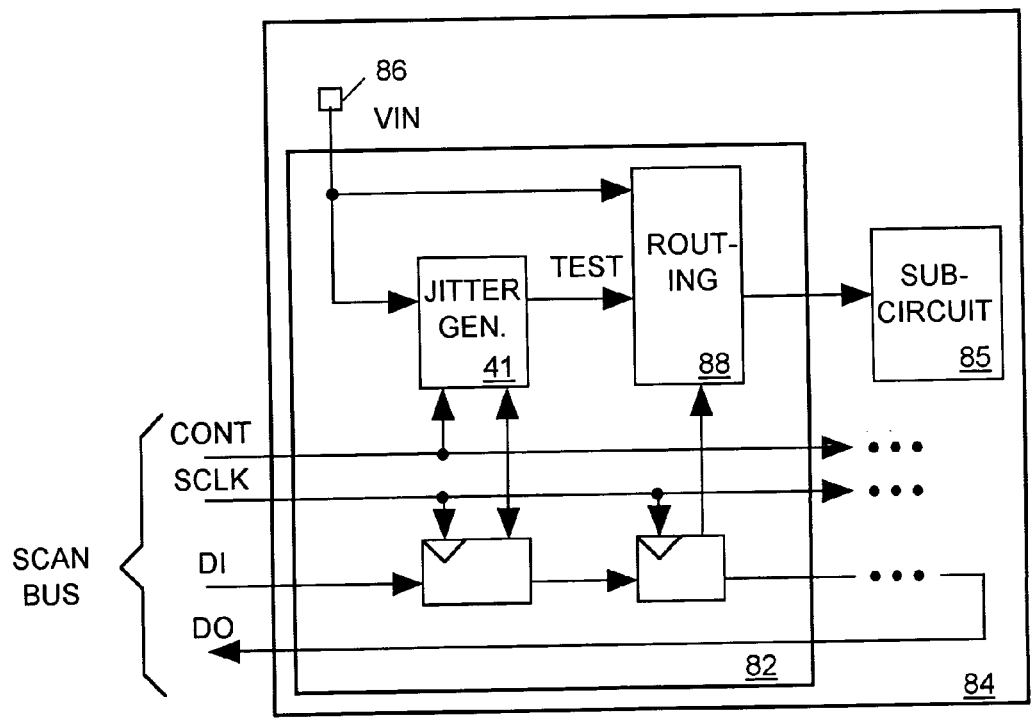

FIG. 7 illustrates another example BIST circuit 82 within an IC 84 receiving an input data signal VIN at an IO terminal 86. A jitter generator 41 processes the VIN signal to produce a jittery TEST signal input to a routing circuit 88. Routing circuit 88 normally forwards the VIN signal to subcircuit 85, but during a test, it forwards the TEST signal to subcircuit 85. BIST circuit 82 is useful when an external tester generating the VIN signal during an IC test is not capable of making the VIN signal jitter with a specified jitter pattern as is often the case, for example, when VIN is a high frequency clock signal or a data signal of a serialization-deserialization (SERDES) communication system.

Figure 8:
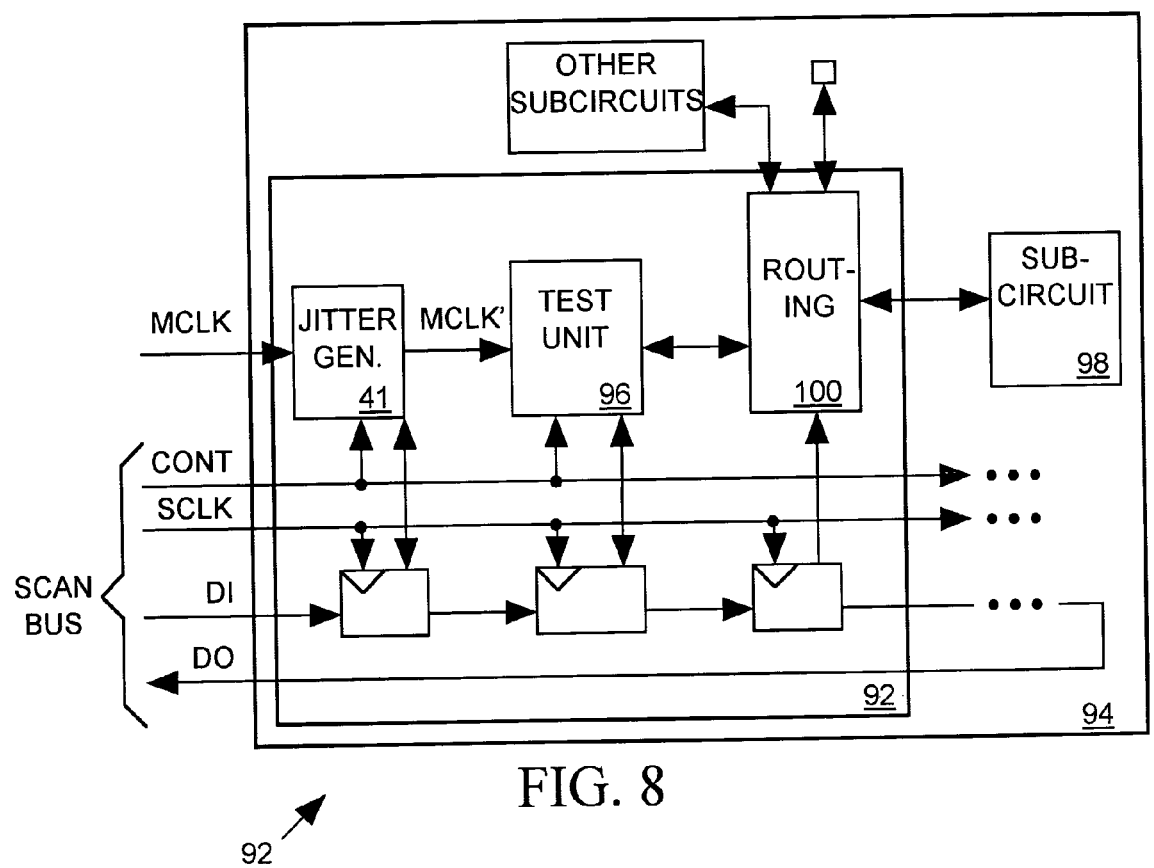

FIG. 8 illustrates an example BIST circuit 92 within an IC 94 wherein a jitter generator 41 receives a clock signal MCLK and produces a jittery clock signal MCLK'. A test unit 96 uses the MCLK' signal to control edge timing of all data signal inputs it supplies to a subcircuit 98 of IC 94 via routing circuit 100 during a jitter test. Test unit 96 monitors outputs of subcircuit 98 during the test and reports results back to a host via a scan bus system.

Figure 9:
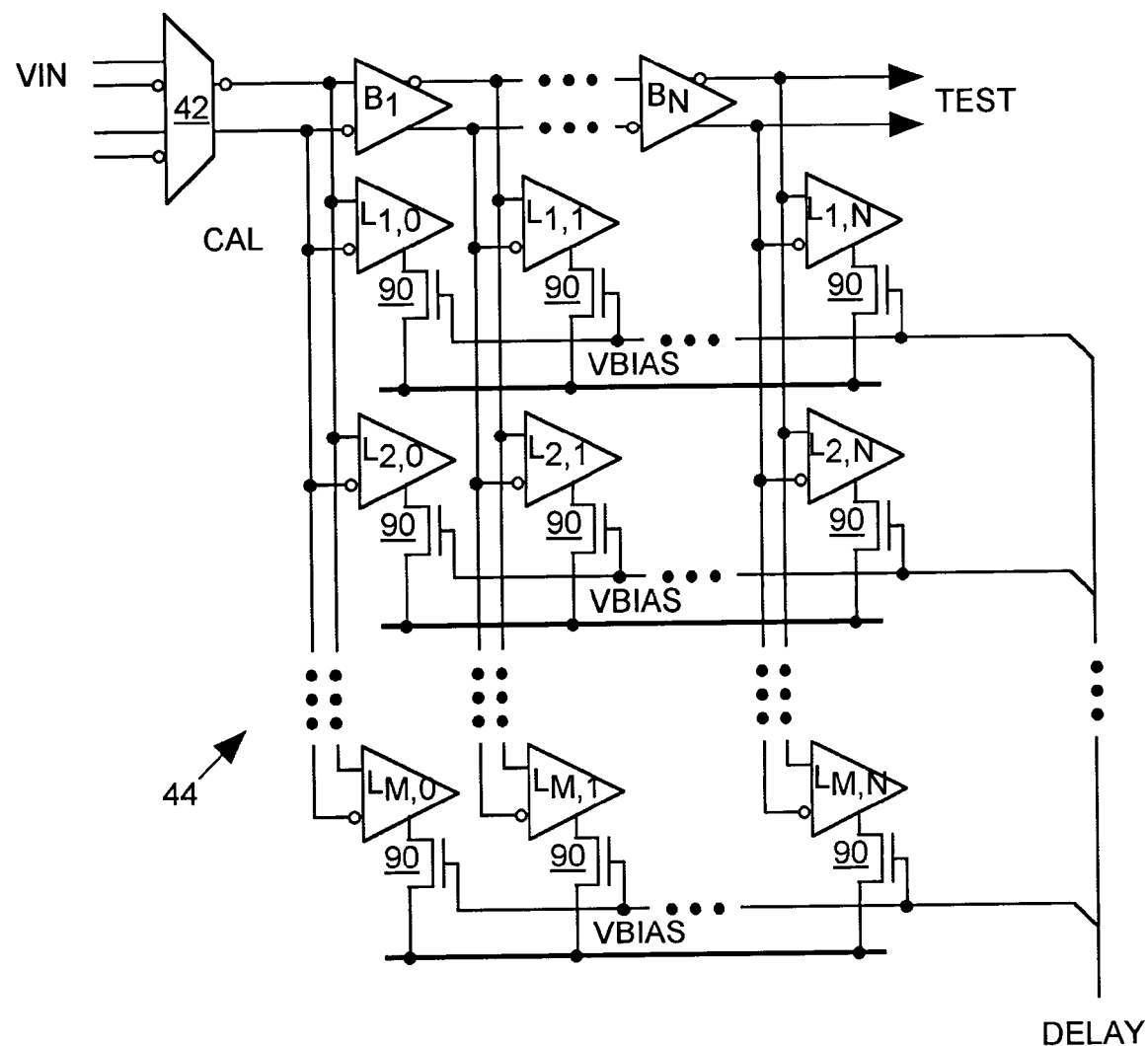
FIGS. 9–11 depict in block diagram form alternative exemplary embodiments of a programmable delay circuit suitable for use in the jitter generator of FIG. 4.
Figure 10:
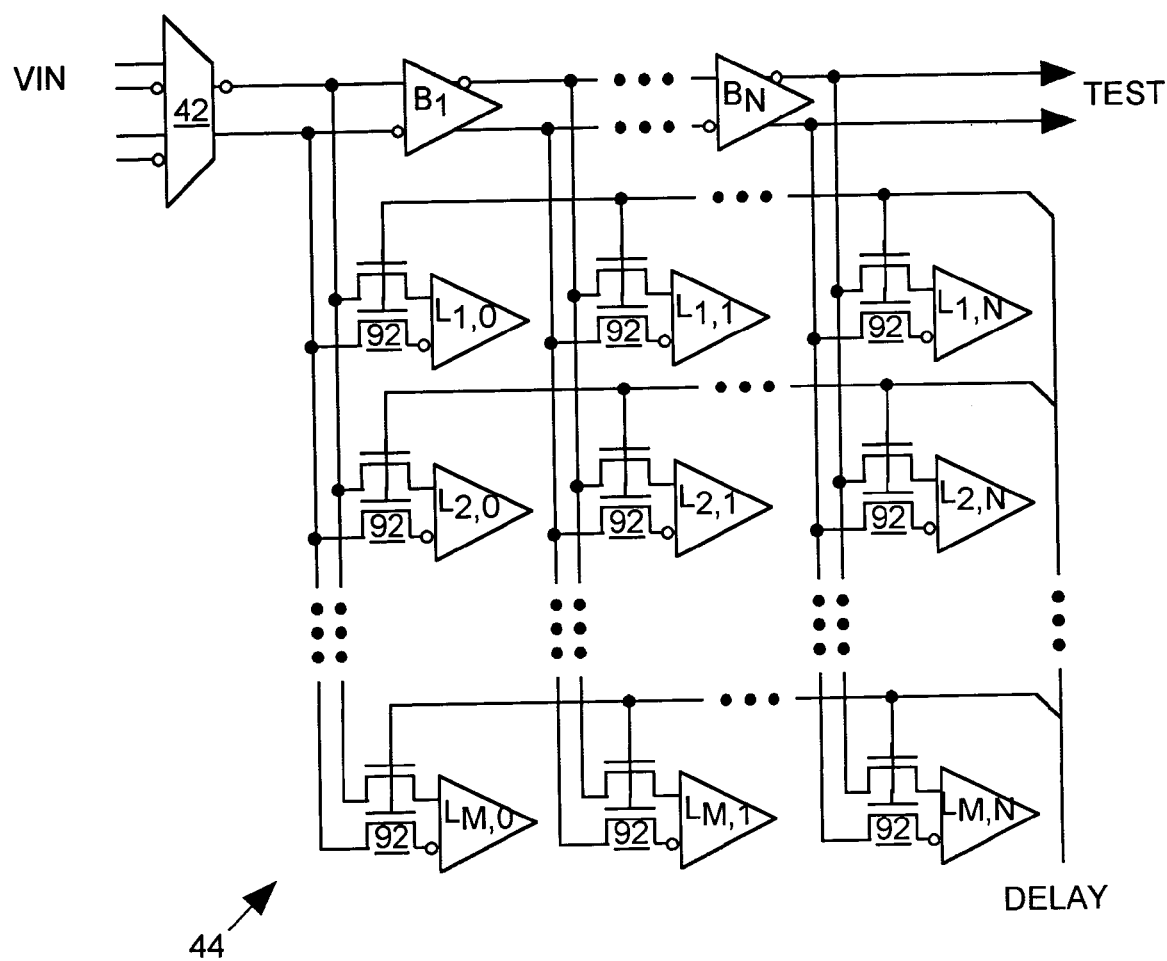

Various ways of implementing capacitive circuit elements 45 of FIG. 4 are possible. For example, FIG. 9 depicts the variable capacitors as an array of gates $L_{1,0}$–$L_{M,N}$, such as buffers or other types of gates, having inputs connected in parallel with the outputs of multiplexer 42 and buffers $B_1$–$B_N$. Bits of each successive DELAY word control transistor switches 90 for selectively connecting each gate to a bias supply (VBIAS). When switches 90 connect any row of gates $L_{1,0}$–$L_{M,N}$ to bias supply VBIAS, the capacitive load they provide at the outputs of multiplexer 42 and buffers $B_1$–$B_N$ increases due to the well-known Miller effect. Alternatively, as illustrated in FIG. 10, a set of switches 92 controlled by bits of each DELAY word can connect inputs of selected ones of load gates $L_{1,0}$–$L_{M,N}$ to outputs of multiplexer 42 and buffers $B_1$–$B_N$. Each load gate $L_{1,0}$–$L_{M,N}$ is continuously connected to its bias and power supply sources. All load gates $L_{1,0}$–$L_{M,N}$ of either FIG. 9 or 10 may be identical, or they may be formed of transistors of varying size so that the load gates provide substantially differing amounts of load capacitance. For example load gates $L_{1,0}$–$L_{M,N}$ can be sized so that gates on each $(i+1)^{th}$ row of the array provide twice the capacitance as gates on the $i^{th}$ row of the array. Using non-uniform gates increases the delay circuit's delay range and resolution.

In the programmable delay circuits of FIGS. 9 and 10, the capacitance at the outputs of multiplexer 42 and every buffer $B_{1-N}$ is the same at any given time, and when the DELAY data value changes, the capacitance at the multiplexer and all buffer outputs change by the same amount. The resulting change in VIN-to-TEST signal delay is therefore every distributed over the entire length of delay circuit 44 so that none of the outputs of multiplexer 42 or buffers $B_1$–$B_N$, including the TEST signal, exhibit a large abrupt phase change in response to a change in DELAY data. By distributing the change in signal delay resulting from a change in DELAY data value, delay circuit 44 of FIG. 9 or 10 permits changes in delay DATA value to be asynchronous with input signal VIN without causing large glitches in the TEST signal.

Figure 11:
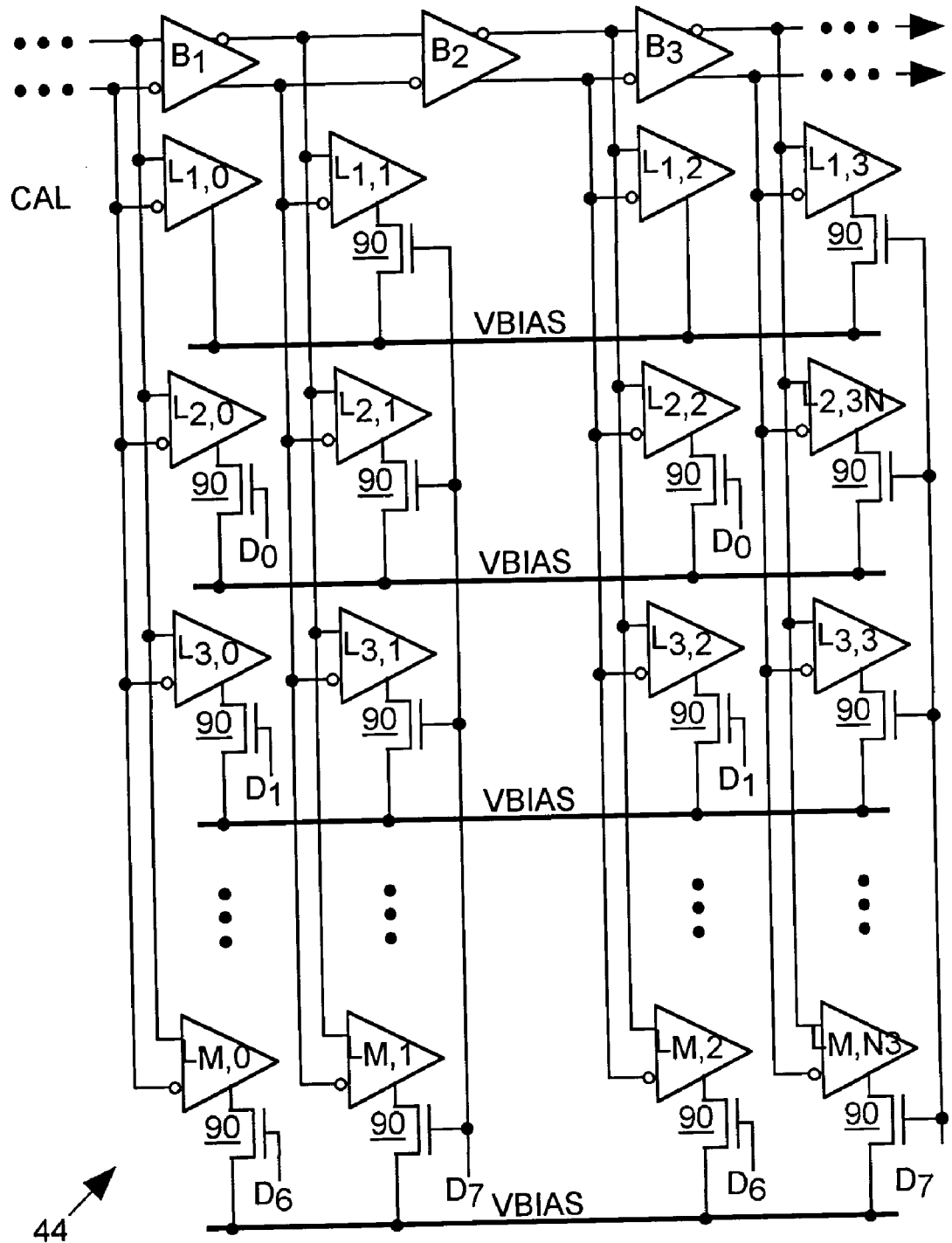

In alternative embodiments of the invention, programmable delay circuit 444 of FIG. 4 may provide other relationships between the DELAY data value and capacitance 45 at the output of multiplexer 42 and buffers $B_1$–$B_N$. For example, for very high-resolution delay control, the DELAY data may independently control the capacitance 45 at each buffer output. FIG. 11 illustrates an example implementation of programmable delay circuit 44 similar to that of FIG. 9 except that for an 8-bit input DELAY word having bits $\{D_0, D_1 \ldots D_7\}$, 1. each gate $L_{1,y}$, wherein y is even, is hard-wired to VBIAS,
2. each gate $L_{x,y}$, wherein $1<x<7$ and y is even, is connected to VBIAS though a gate 90 controlled by DELAY data bit $D_{X-2}$, and
3. each gate $L_{x,y}$, wherein y is odd, is connected to VBIAS through a gate 90 controlled by DELAY data bit $D_7$.

In the example of FIG. 11, when the input capacitance of each gate $L_{x,y}$ is $2^y$ times a unit capacitance when connected to VBIAS, the 8-bit DELAY data can set delay circuit 44 to any of 256 different delays. When each gate $L_{x,y}$ has the same input capacitance when connected to VBIAS, the 8-bit DELAY data can set delay circuit 44 to any of 9 different delays.

The foregoing specification and the drawings depict exemplary embodiments of the best modes of practicing the invention, and elements or steps of the depicted best modes exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiments of the invention depicted in the specification and drawings.

The invention claimed is:

1. An apparatus for providing a jittery test signal for use in an integrated circuit (IC) test, the apparatus comprising:
    a programmable delay circuit for delaying a first signal with an adjustable delay controlled by an input digital delay word to produce a the jittery test signal for use in the IC, and
    first means for supplying a sequence of digital data words as input to the programmable delay circuit for varying the adjustable delay so that the test signal jitters relative to the first signal.

2. The apparatus in accordance with claim 1 wherein the programmable delay circuit resides within the IC.

3. The apparatus in accordance with claim 2 wherein the first means comprises a programmable pattern generator.

4. The apparatus in accordance with claim 3 wherein the first means resides within the IC.

5. The apparatus in accordance with claim 4 wherein the IC includes a subcircuit and wherein the apparatus further comprises:
    second means within the IC for selectively applying either the first signal or the test signal as an input signal to the subcircuit.

6. The apparatus in accordance with claim 5 further comprising:
means for delivering the first signal from an input terminal of the IC to the second means.

7. The apparatus in accordance with claim 5 further comprising:
second means within the IC for selectively applying either a second signal or the test signal as an input signal to the subcircuit.

8. The apparatus in accordance with claim 7 further comprising:
third means residing within the IC for generating the first signal.

9. The apparatus in accordance with claim 8 wherein the third means also monitors an output signal of the subcircuit to determine whether it behaves in a particular manner while the second means applies the test signal as the input signal to the subcircuit.

10. The apparatus in accordance with claim 1
wherein the first means alternatively continuously supplies a digital data word to the programmable delay circuit to hold the adjustable delay constant, and
wherein the apparatus further comprises:
a multiplexer for receiving a second signal and the test signal and for selectively supplying either the second signal or the test signal as the first signal input to the programmable delay circuit, wherein the test signal oscillates when the multiplexer supplies the test signal as the first signal input to the programmable delay circuit with a period that is a function of delay provided by the programmable delay circuit when the first means continuously supplies a digital data word to the programmable delay circuit to hold the adjustable delay constant.

11. The apparatus in accordance with claim 10 further comprising:
third means for generating data that is a function of a period of the test signal when the multiplexer supplies the test signal as the first signal input to the programmable delay circuit while the first means continuously supplies a digital data word to the programmable delay circuit to hold the adjustable delay constant.

12. The apparatus in accordance with claim 1
wherein the first means comprises a programmable pattern generator for supplying a sequence of digital delay data words to the programmable delay circuit for varying its delay with time and for alternatively continuously supplying a digital data word to the programmable delay circuit to hold its delay constant,
wherein the IC includes a subcircuit, and
wherein the apparatus further comprises:
second means for selectively applying the test signal as an input signal to the subcircuit; and
a multiplexer for receiving a second signal and the test signal and for supplying the second signal as the first signal input to the programmable delay circuit while the first means is supplying the sequence of digital delay words to the programmable delay circuit and for supplying the test signal as the first signal input to the programmable delay circuit while the first means is continuously supplying a digital data word to the programmable delay circuit to hold its delay constant,
wherein the test signal oscillates when the multiplexer supplies the test signal as the first signal input to the programmable delay circuit with a period that is a function of the constant delay of the programmable delay circuit.

13. The apparatus in accordance with claim 12
wherein the programmable delay circuit, the programmable pattern generator, the second means, and the multiplexer reside within the IC.

14. The apparatus in accordance with claim 13 further comprising:
third means residing within the IC for generating data that is a function of a period of the test signal when test signal oscillates.

15. The apparatus in accordance with claim 1 wherein the programmable delay circuit comprises:
a plurality of buffers connected in cascade, each having an output; and
a plurality of capacitive circuit elements, each corresponding to a separate one of the buffers and each providing an adjustable capacitance at an output of its corresponding buffer, wherein the first means controls the delay of the programmable delay circuit by adjusting the adjustable capacitance provided by each of the plurality of capacitive elements.

16. The apparatus in accordance with claim 15 wherein first means always adjusts the adjustable capacitance of the capacitive circuit elements so that they provide substantially similar amounts of capacitance at the outputs of their corresponding buffers.

17. The apparatus in accordance with claim 15 wherein first means independently adjusts the adjustable capacitance of each capacitive circuit element.

18. The apparatus in accordance with claim 15 wherein first means can adjust the adjustable capacitance of at least two of the capacitive circuit elements so that they provide differing amounts of capacitance at the outputs of their corresponding buffers.

19. The apparatus in accordance with claim 15 wherein each capacitive circuit element comprises:
a plurality of capacitors, and
a plurality of switches controlled by the first means for coupling selected ones of the capacitors to the output of the buffer corresponding to the capacitive circuit element.

20. The apparatus in accordance with claim 19 wherein each capacitor is provided by an input of a gate having capacitive input impedance.

21. The apparatus in accordance with claim 15 wherein each capacitive circuit element comprises:
a plurality of gates having inputs linked to the output of the buffer corresponding to the capacitive circuit element, wherein an input capacitance of each gate is a function of a voltage applied to the gate, wherein the first means controls a magnitude of the voltage applied to each gate.

22. A method for testing a subcircuit of an integrated circuit (TC), the subcircuit having an input for receiving an input signal and an output for producing an output signal, the method comprising the steps of:
a. providing a programmable delay circuit having an adjustable delay controlled by digital delay control data supplied to the programmable delay control circuit;
b. applying a first signal as input to the programmable delay circuit such that the programmable delay circuit delays the first signal to produce a test signal, and c. supplying a sequence of digital control data to the programmable delay circuit that varies the adjustable delay during step b such that the test signal jitters relative to the first signal.

23. The method in accordance with claim 22 further comprising the steps of:
   d. inverting and applying the test signal as input to the programmable delay circuit and supplying digital delay control data to the programmable delay circuit that holds its adjustable delay constant, such that the test signal oscillates with a period that is a function of the adjustable delay;
   e. measuring the period of the test signal;
   f. carrying out a plurality of iterations of steps d and e with the adjustable delay held to a different constant value during each iteration.

24. The method on accordance with claim 23 wherein step e comprises counting a number of periods of a periodic reference clock signal occurring during a predetermined number of periods of the test signal.

25. The method in accordance with claim 22 wherein step a comprises the forming the programmable delay circuit within the IC.

26. The method in accordance with claim 25 wherein step c comprises the substeps of:
   c1. forming a programmable pattern generator within the IC; and
   c2. programming the programmable pattern generator to generate the sequence of digital delay control data.

27. The method in accordance with claim 25 wherein the programmable delay circuit comprises:
   a plurality of cascaded buffers connected in series, each having a output; and
   means for applying a capacitance of magnitude controlled by the digital delay control data to the outputs of the buffers.

28. The method in accordance with claim 27 wherein any change in value of the digital delay control data applied to the programmable delay circuit during step c causes a change in the magnitude of the capacitance applied to the output of each of the cascaded buffers.

29. The method in accordance with claim 25 further comprising the step of:
   d. providing means within the IC for monitoring the output signal of the subcircuit to determine whether the output signal behaves in a particular manner and for sending data from the IC indicating wherein the output signal behaved in that particular manner.

30. The method in accordance with claim 22 further comprising the step of:
   g. ascertaining values of digital control data included in the sequence supplied at step c needed to produce a particular jitter pattern in the test signal generated at step c based on the periods of the test signal measured during the plurality of iterations of step c.

31. An apparatus for testing a subcircuit of an integrated circuit (IC), the subcircuit having an input for receiving an input signal and an output for producing an output signal, the apparatus comprising:
   a programmable delay circuit residing within the IC for delaying a first clock signal to with a delay selected by a digital delay control word input to the programmable delay circuit to produce a second clock signal;
   a programmable pattern generator for providing a sequence of delay control words as input to the programmable delay circuit;
   first means for selectively applying the second clock signal as the input signal to the subcircuit;
   a multiplexer residing within the IC for receiving a third clock signal and the second clock signal for selectively supplying either the third clock signal or the second clock signal as the first clock signal input to the programmable delay circuit, wherein the second clock signal oscillates when supplied as the first clock signal input to the programmable delay circuit with a period that is a function of the delay provided by the programmable delay circuit; and
   a test circuit receiving the second clock signal and for generating a test signal having edges synchronized to edges of the second clock signal.

32. The apparatus in accordance with claim 31 wherein the programmable delay circuit comprises:
   a plurality of buffers connected in series, each having an output; and
   second means for adding capacitance of magnitude controlled by each successive digital delay control word of the sequence to outputs of the buffers.

33. The apparatus in accordance with claim 32 wherein the second means comprises:
   a plurality of capacitors, and
   a plurality of switches controlled by each successive delay control word of the sequence for selectively coupling the capacitors to inputs of the buffers.

34. The apparatus in accordance with claim 31 further comprising:
   second means residing within the IC for monitoring the output signal of the subcircuit to determine whether it behaves in a particular manner in response to the test signal.

35. The apparatus in accordance with claim 31 further comprising:
   second means for counting a number of periods off a periodic reference clock signal occurring during a predetermined number of periods of the test signal.

* * * * *

UNITED STATES PATENT AND TRADEMARK OFFICE
CERTIFICATE OF CORRECTION

PATENT NO. : 7,171,601 B2 Page 1 of 1
APPLICATION NO. : 10/646957
DATED : January 30, 2007
INVENTOR(S) : Arnold M. Frisch It is certified that error appears in the above-identified patent and that said Letters Patent is hereby corrected as shown below:

Column 8
Line 50, "a the jittery test signal" should be --the jittery test signal-- .

Column 9
Line 31, "function of delay" should be --function of the delay-- .

Column 10
Line 59, " (TC) " should be -- (IC) -- .

Column 12
Line 8, "signal to with a delay" should be --signal with a delay-- .

Signed and Sealed this

Twenty-second Day of May, 2007

JON W. DUDAS
*Director of the United States Patent and Trademark Office*